US011532697B2

(12) United States Patent
Tsai et al.

(10) Patent No.: US 11,532,697 B2
(45) Date of Patent: Dec. 20, 2022

(54) SEMICONDUCTOR STRUCTURE AND METHOD FOR FORMING THE SAME

(71) Applicant: TAIWAN SEMICONDUCTOR MANUFACTURING COMPANY LTD., Hsinchu (TW)

(72) Inventors: Yi Jen Tsai, New Taipei (TW); Yuan-Tai Tseng, Hsinchu County (TW); Chern-Yow Hsu, Hsin-Chu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 292 days.

(21) Appl. No.: 16/654,874

(22) Filed: Oct. 16, 2019

(65) Prior Publication Data

US 2021/0118981 A1 Apr. 22, 2021

(51) Int. Cl.
| | |
|---|---|
| *H01L 21/02* | (2006.01) |
| *H01L 49/02* | (2006.01) |
| *H01L 23/528* | (2006.01) |
| *H01L 23/522* | (2006.01) |
| *H01L 21/3213* | (2006.01) |

(52) U.S. Cl.
CPC ........ *H01L 28/60* (2013.01); *H01L 21/32133* (2013.01); *H01L 23/528* (2013.01); *H01L 23/5223* (2013.01)

(58) Field of Classification Search
CPC ......... H01L 28/40; H01L 28/55; H01L 28/57; H01L 28/60; H01L 28/92; H01L 29/92; H01L 29/7408; H01L 23/522; H01L 23/528; H01L 23/5223; H01L 49/02; H01L 27/0805; H01L 27/3265; H01L 2924/1205; H01L 21/3213; H01L 21/32133

USPC ........................................................ 257/532
See application file for complete search history.

(56) References Cited

U.S. PATENT DOCUMENTS

| 9,627,312 B2 | 4/2017 | Childs et al. | |
|---|---|---|---|
| 2007/0090432 A1* | 4/2007 | Schwantes | .......... H01L 27/0805 438/243 |
| 2011/0080687 A1* | 4/2011 | Bar | ........................ H01L 22/20 361/306.1 |

(Continued)

FOREIGN PATENT DOCUMENTS

TW 201320305 A1 5/2013

OTHER PUBLICATIONS

Office Action, Cited Reference and Search Report dated Jan. 29, 2021 issued by Taiwan Intellectual Property Office of Taiwan counterpart application No. 109110697.

(Continued)

*Primary Examiner* — Chuong A Luu
(74) *Attorney, Agent, or Firm* — WPAT Law; Anthony King

(57) ABSTRACT

A semiconductor structure includes a substrate, a first electrode over the substrate, a second electrode over the first electrode, and a first insulating layer between the first electrode and the second electrode. The first insulating layer has a first portion and a second portion coupled to the first portion, the second portion of the first insulating layer is in contact with the second electrode, the first portion is separated from the second electrode by the second portion. A thickness of the second portion is greater than a thickness of the first portion.

20 Claims, 14 Drawing Sheets

(56) References Cited

U.S. PATENT DOCUMENTS

2013/0270675 A1* 10/2013 Childs ................. H01L 23/5226
 257/532
2020/0006470 A1* 1/2020 Chang ................... B81B 3/0086

OTHER PUBLICATIONS

U.S. Pat. No. 9,627,312B2 is the US counterpart of TW201320305A1.

* cited by examiner

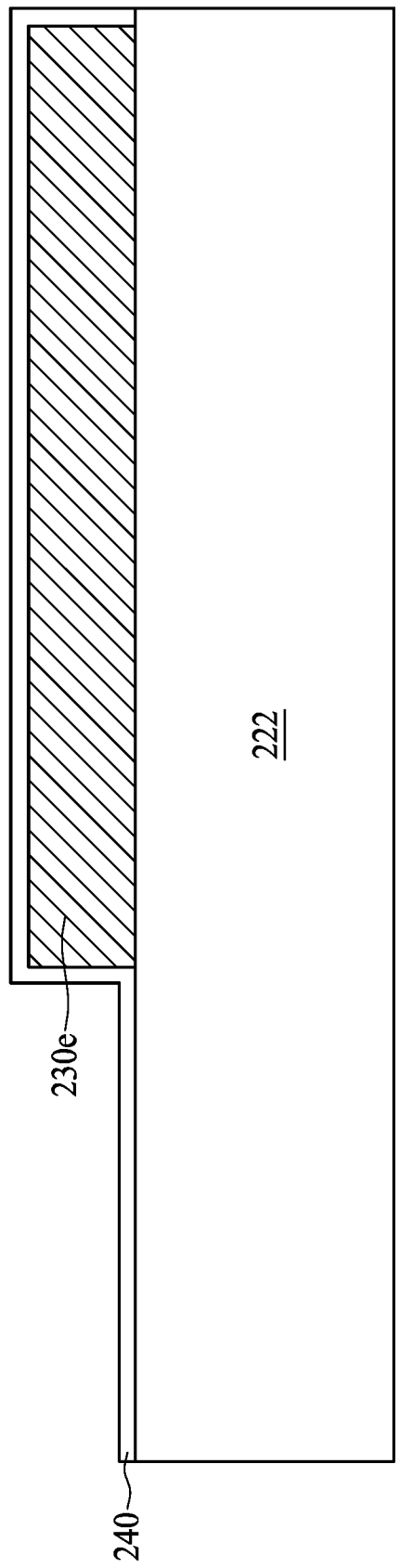

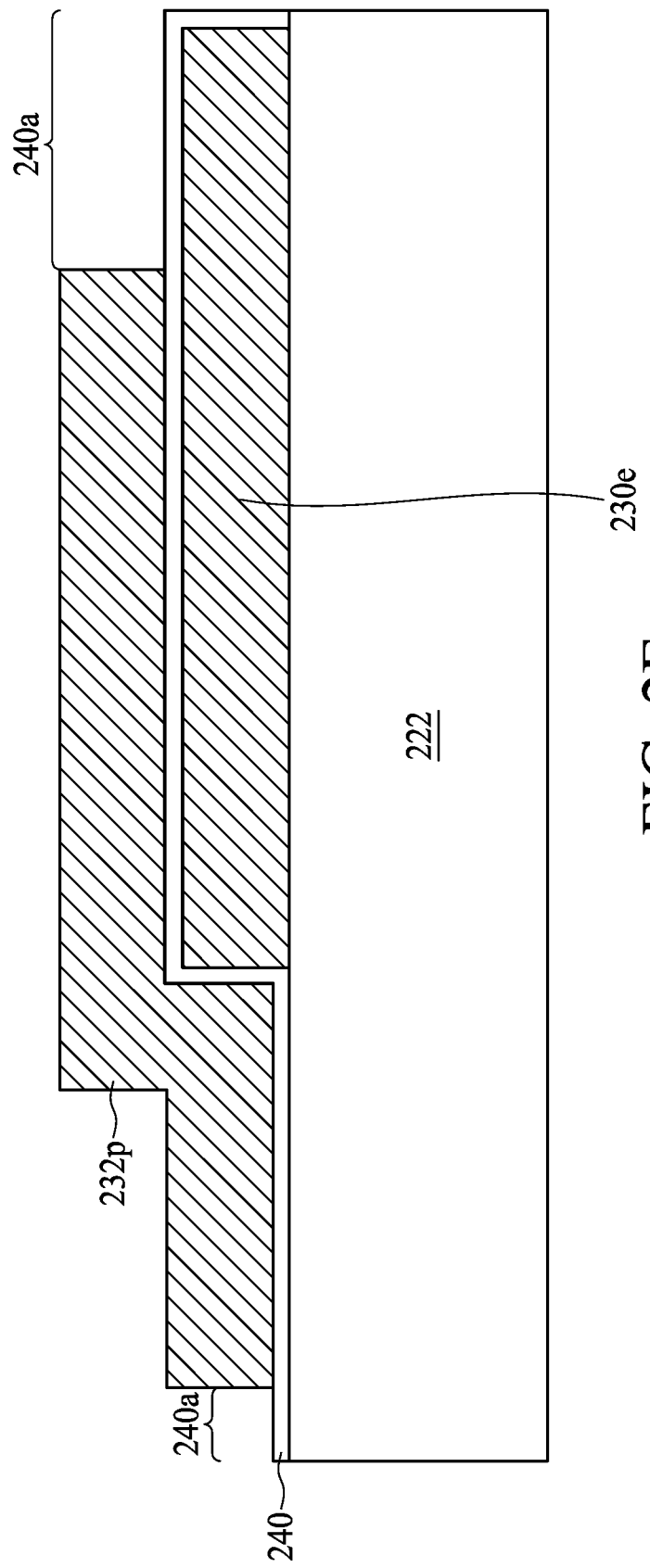

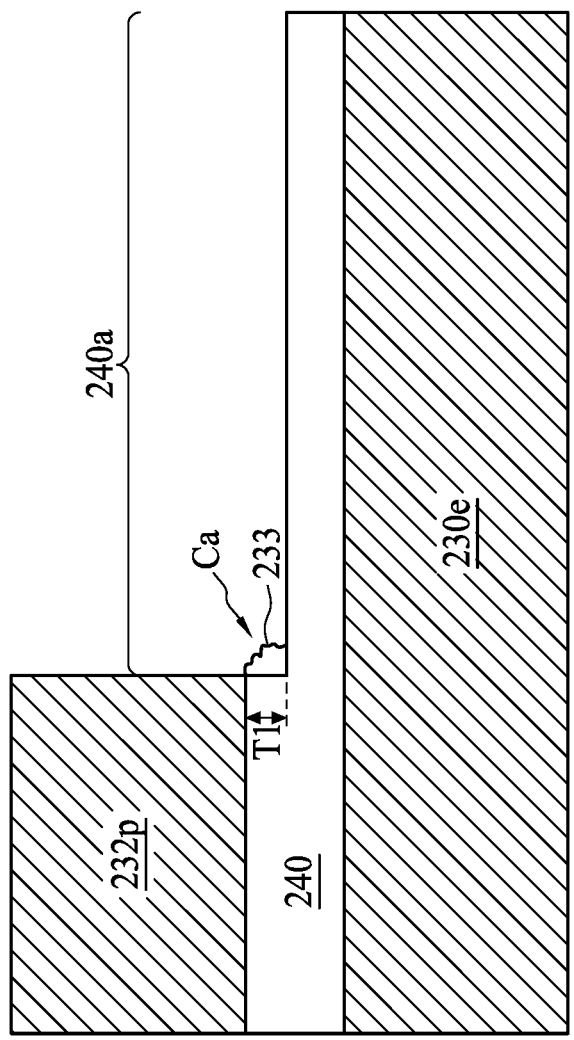

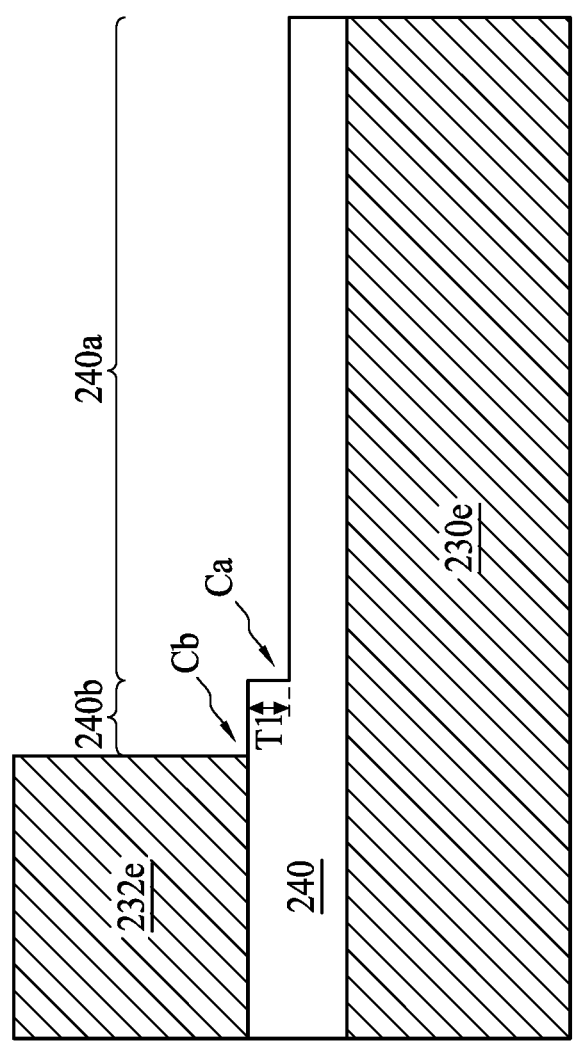

SEMICONDUCTOR STRUCTURE AND METHOD FOR FORMING THE SAME

BACKGROUND

Integrated chips are formed on semiconductor dies that include millions or billions of transistor devices. The transistor devices are configured to act as switches and/or to produce power gains so as to enable logical functionality for an integrated chip (e.g., functionality to perform logic functions). Integrated chips often also include passive devices, such as capacitors, resistors, inductors, varactors, etc. Passive devices are widely used to control integrated chip characteristics (e.g., gain, time constants, etc.) and to provide an integrated chip with a wide range of different functionalities (e.g., incorporating both analog and digital circuitry on the same die).

Of the passive devices, capacitors such as the metal-insulator-metal (MIM) capacitors, which include at least a top metal plate and a bottom metal plate separated by a capacitor dielectric, are often implemented in integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A to 2M are schematic drawings illustrating a semiconductor structure at various fabrication stages constructed according to aspects of the present disclosure in one or more embodiments.

DETAILED DESCRIPTION

Figure 1:
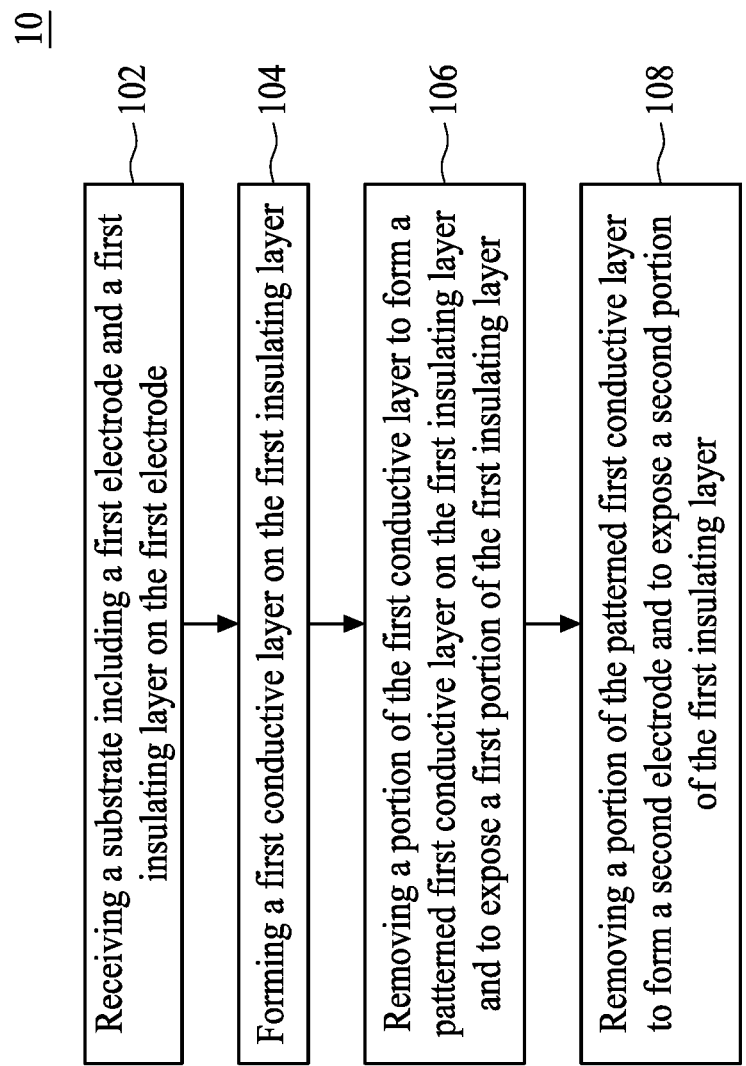
FIG. 1 is a flowchart representing a method for manufacturing a semiconductor structure according to aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

MIM capacitors can be used as decoupling capacitors configured to reduce variance in a power supply to mitigate switching noise caused by changes in current. In some embodiments, MIM capacitors are integrated in a back-end-of-the-line (BEOL) metallization stack, at a position that is disposed between an underlying metal layer and an overlying metal layer. However, positioning a MIM capacitor within a BEOL metallization stack can present a number of fabrication problems. For example, MIM capacitors typically have a large number of layers, resulting in a topography that is more irregular than most BEOL metallization layers (e.g., having a step size of more than 400 nm). In some embodiments, MIM capacitors are therefore disposed over, instead of within, the BEOL metallization stack to avoid the topography problem. In some embodiments, MIM capacitors are disposed within or over a redistribution layer (RDL). However, other issues remain.

During the forming of the MIM capacitor, metal layers are deposited and patterned to form the electrodes. In some comparative embodiments, the dielectric layer between the metal layers may be damaged and a thickness of the dielectric layer may be undesirably reduced. Consequently, a higher electric potential may be induced due to a fringe effect; therefore, breakdown voltage (Vbd) of the MIM capacitor may be reduced, which is undesired, and a Vbd failure issue arises. In addition, during the patterning of the electrodes, various etching techniques are used. However, it is found that metallic by-products may be left after the patterning of the electrodes, regardless of the etching technique used. The metallic by-product may remain on corners of the patterned layers and are not easily removed. The remaining metallic by-product may present an undesired leakage path and thus the breakdown voltage is reduced and the Vbd failure issue is induced.

The present disclosure therefore provides a semiconductor structure and a method for forming the same that are able to mitigate the Vbd failure issue.

FIG. 1 is a flowchart representing a method for manufacturing a semiconductor structure according to aspects of the present disclosure. The method 10 includes an operation 102, in which a substrate is received. In some embodiments, the substrate includes a first electrode and a first insulating layer formed thereon. The method 10 further includes an operation 104, in which a first conductive layer is formed on the first insulating layer. The method 10 further includes an operation 106, in which a portion of the first conductive layer is removed to form a patterned first conductive layer on the first insulating layer and to expose a first portion of the first insulating layer. The method 10 further includes an operation 108, in which a portion of the patterned first conductive layer is removed to form a second electrode and to expose a second portion of the first insulating layer. The method 10 will be further described according to one or more embodiments. It should be noted that the operations of the method 10 may be rearranged or otherwise modified within the scope of the various aspects. It should further be noted that additional processes may be provided before, during, and after the method 10, and that some other processes may be only briefly described herein. Thus other implementations are possible within the scope of the various aspects described herein.

Figure 2A:
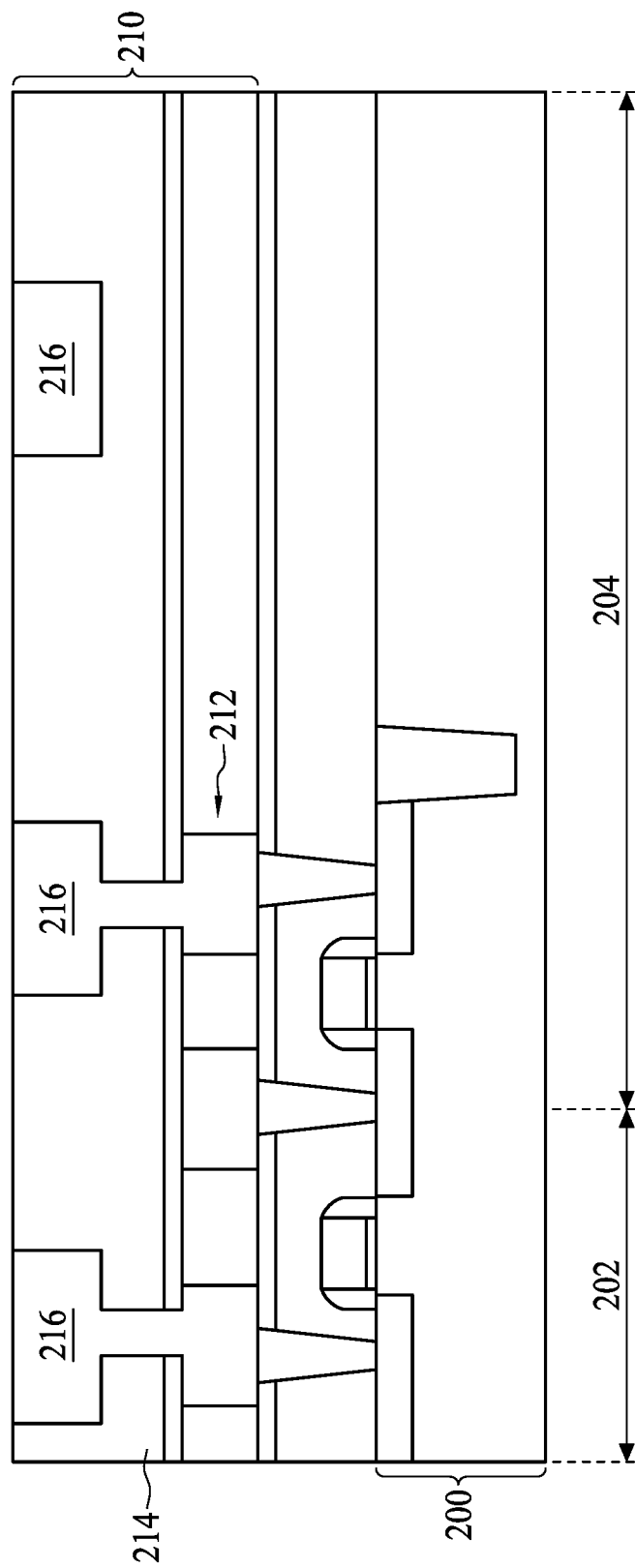

Please refer to FIGS. 2A to 2M, which are schematic drawings illustrating a semiconductor structure 20 at various fabrication stages constructed according to aspects of the present disclosure in one or more embodiments. Referring to FIG. 2A, a substrate 200 is received or provided according to operation 102. In some embodiments, the substrate 200 (also referred to as a die substrate) may include a bulk silicon substrate or a silicon-on-insulator (SOI) substrate. In other embodiments, the substrate 200 may include semiconductor materials that include group III, group IV, and/or group V elements. For example, the substrate 200 may include germanium (Ge), silicon germanium (SiGe), silicon carbide (SiC), gallium arsenide (GaAs), or the like. The substrate 200 may be a p-type semiconductive substrate (acceptor type) or an n-type semiconductive substrate (donor type).

Still referring to FIG. 2A, in some embodiments, a periphery region 202 and a cell region 204 can be defined over the substrate 200. Various electrical components may be formed over the substrate 200. Examples of the electrical components include active devices, such as transistors and diodes, and passive devices, such as capacitors, inductors, and resistors. As shown in FIG. 2A, in some embodiments, active devices, i.e., the transistors can be formed over the substrate 200 in the periphery region 202, while the capacitors can be formed over the substrate 200 in the cell region 204. The substrate 200 may include an interconnection structure 210 disposed therein. The interconnection structure 210 may include a plurality of conductive features 212, such as conductive lines or conductive vias, and insulating layers 214 electrically insulating the conductive features 212. The conductive features 212 at a same level are collectively referred to as a metal layer or a connecting layer. Referring to FIG. 2A, a topmost conductive line 216 of the interconnection structure 210 is shown. However those skilled in the art would easily realize that the interconnection structure 210 may include a plurality of connecting layers interconnected through the conductive vias, though not shown.

In some embodiments, the conductive features 212 can include a metal such as copper (Cu), tungsten (W), or aluminum (Al), but the disclosure is not limited to this. Additionally, a barrier layer 218 (shown in FIG. 2B) is disposed between the conductive features 212 and the insulating layers 214 to prevent metal diffusion, but the disclosure is not limited thereto.

Figure 2B:
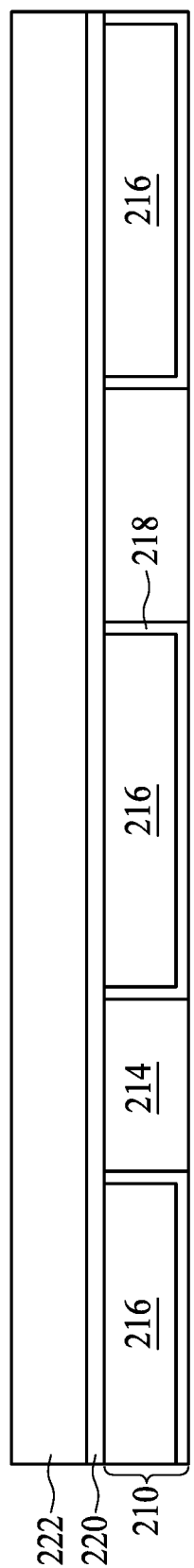

Please refer to FIG. 2B, which is a partially enlarged view of the interconnection structure 210 in FIG. 2A. It should be easily realized that only the insulating layer 214 and the topmost connecting layer 216 are shown in FIG. 2B for clarity. In some embodiments, an insulating layer 220 and an insulating layer 222 may be disposed over the substrate 200 and the interconnection structure 210. In some embodiments, the insulating layers 220 and 222 may be formed with a variety of dielectric materials and may, for example, be oxide (e.g., Ge oxide), nitride, oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), a polymer material, or the like. In some embodiments, the insulating layers 220 and 222 can include different materials. For example, the insulating layer 220 can include a SiN layer and the insulating layer 222 can be a plasma enhanced oxide (PEOX)-undoped silicate glass (USG) (PEOX-USG) layer, but the disclosure is not limited to this. The insulating layers 220 and 222 may be formed using CVD, PVD, spin-on coating, or other suitable operation. In an embodiment, the insulating layer 220 has a thickness between approximately 500 Angstroms (Å) and approximately 1000 Å, but the disclosure is not limited to this. In an embodiment, the insulating layer 222 has a thickness between approximately 4000 Å and approximately 5000 Å, but the disclosure is not limited to this.

Figure 2D:
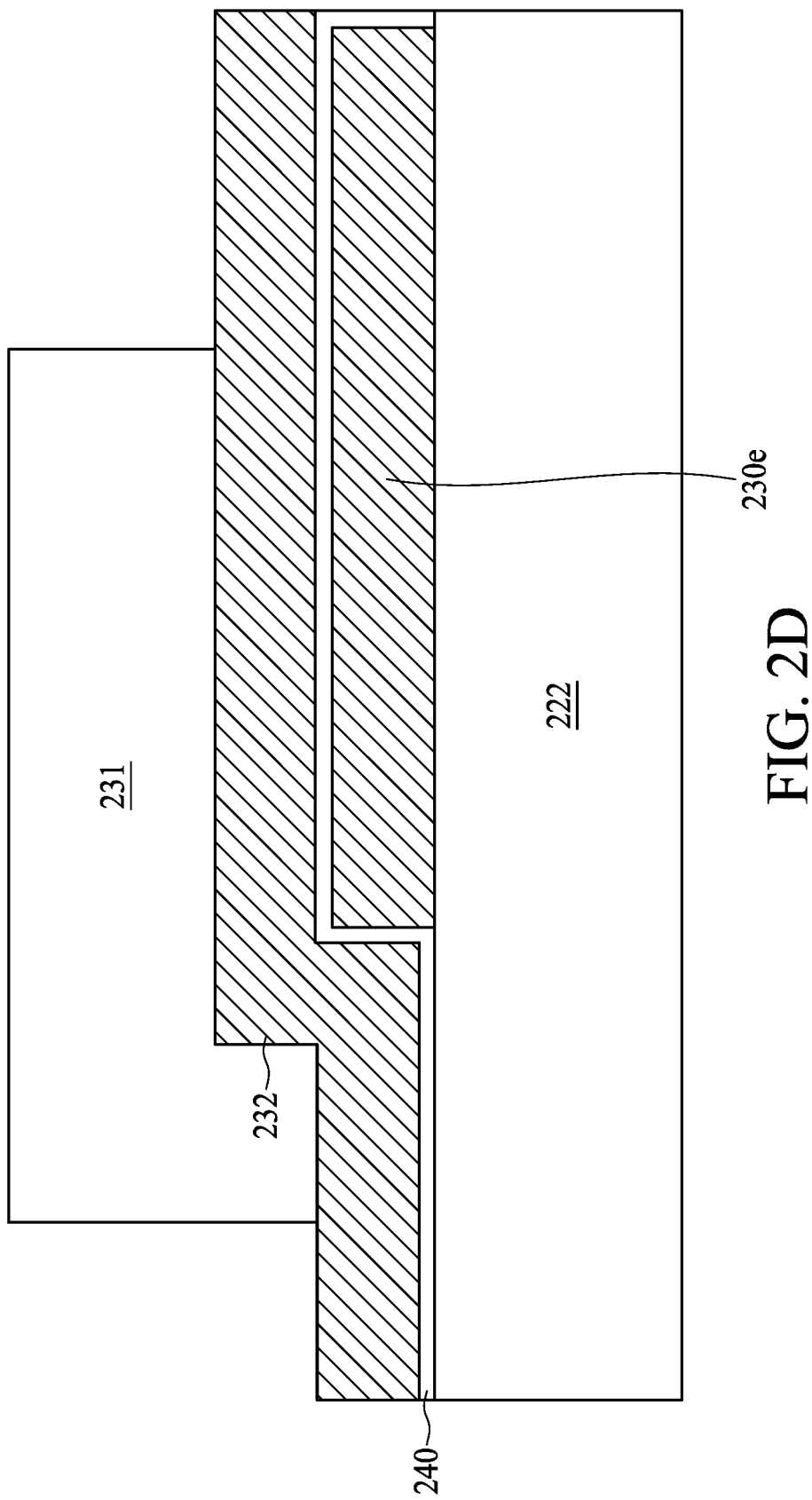

Please refer to FIGS. 2C to 2E, which are partially enlarged views of FIG. 2B. Referring to FIG. 2C, a first electrode 230e is formed over the substrate 200 and an insulating layer 240 is formed over the first electrode 230e. In some embodiments, the first electrode 230e can be obtained by forming a conductive layer (not shown) on the insulating layer 222 and patterning the conductive layer. Suitable methods for forming and patterning of the conductive layer are not detailed for brevity. The first electrode 230e may include various conductive materials, such as indium tin oxide (ITO), aluminum (Al), titanium (Ti), titanium nitride (TiN), tantalum (Ta), tantalum nitride (TaN), tungsten (W), tungsten nitride (WN), molybdenum nitride (MoN), copper (Cu), platinum (Pt), palladium (Pd), osmium (Os), ruthenium (Ru), iridium dioxide ($IrO_2$), rhenium dioxide ($ReO_2$), rhenium trioxide ($ReO_3$), or a combination thereof. In some embodiments, a thickness of the first electrode 230e may be between approximately 100 angstroms (Å) and approximately 800 Å, but the disclosure is not limited to this.

Still referring to FIG. 2C, the insulating layer 240 is conformally formed to cover the first electrode 230e. In some embodiments, the insulating layer 240 may include a high-k dielectric material (i.e., a dielectric material having a dielectric constant greater than silicon dioxide ($SiO_2$)). In various embodiments, the insulating layer 240 can include a single layer. In other embodiments, the insulating layer 240 can include a multiple layer of $SiO_2$, silicon nitride ($Si_4N_4$), aluminum oxide ($Al_2O_3$), tantalum oxide ($Ta_2O_5$), titanium oxide ($TiO_2$), strontium titanate ($SrTiO_4$), zirconium oxide ($ZrO_2$), hafnium oxide ($HfO_2$), hafnium silicate ($HfSiO_4$), lanthanum oxide ($La_2O_4$), yttrium oxide ($Y_2O_3$), or other suitable material. In some embodiments, the insulating layer 240 may include stacked layers of $ZrO_2/Al_2O_3/ZrO_2$ (ZAZ), but the disclosure is not limited to this. In some embodiments, a thickness of the insulating layer 240 can be between approximately 20 Å and approximately 200 Å, but the disclosure is not limited to this. For example, the thickness of the insulating layer 240 can be approximately 60 Å, but the disclosure is not limited thereto.

Referring to FIG. 2D, a conductive layer 232 is formed on the insulating layer 240 according to operation 104. The conductive layer 232 can include the same materials and thickness as the first electrode 230e, and therefore such details are omitted for brevity. As shown in FIG. 2D, the conductive layer 232 can be conformally formed over the substrate 200. Subsequently, a patterned mask layer 231 is formed on the conductive layer 232.

Referring to FIG. 2E, a portion of the conductive layer 232 is removed to form a patterned conductive layer 232p on the insulating layer 240 and expose a first portion 240a of the insulating layer 240 according to operation 106. In some embodiments, the removing of the portion of the conductive layer 232 can include an etching technique, such as a dry etching. Additionally, the patterned mask layer 231 can be removed after the forming of the patterned conductive layer 232p. Further, the first portion 240a refers to any portion of the insulating layer 240 that is exposed through the patterned conductive layer 232p, as shown in FIG. 2E. In some embodiments, the insulating layer 240 is disposed between the patterned conductive layer 232p and the insulating layer 222. In other embodiments, the insulating layer 240 is between the first electrode 230e and the pattered conductive layer 232p.

Please refer to FIG. 2F, which is a partially enlarged view of the first portion 240a in FIG. 2E. As mentioned above, the portion of the conductive layer 232 exposed through the patterned mask layer 231 may be removed by an etching, and the etching not only removes the portion of the conductive layer 232 but may also consume a portion of the insulating layer 240 once the insulating layer 240 is exposed. Therefore, a thickness of the first portion 240a exposed through the patterned conductive layer 232p may be reduced and a corner Ca may be formed between the first portion 240a and another portion of the insulating layer 240 under the patterned conductive layer 232p, as shown in FIG. 2F. In other words, the thickness of the first portion 240a is less than the thickness of the portion of the insulating layer 240 under the patterned conductive layer 232p, and a thickness difference T1 may obtained at the corner Ca, as shown in FIG. 2F. It should be noted that in some embodiments, the thickness difference T1, even if only a few angstroms, may amplify a fringe effect while the thinner first portion 240a of the insulating layer 240 itself induces greater electric potential. Consequently, a Vbd failure issue may arise at the corner Ca. Further, a metallic by-product 233 may be generated during the etching and remains at the corner Ca. It should be noted that because the metallic by-product 233 remains at the corner Ca, it is not easy to remove such metallic by-product 233 even if a cleaning operation is performed.

Referring to FIG. 2G, a portion of the patterned conductive layer 232p is removed according to operation 108. It should be noted that the portion of the patterned conductive layer 232p is removed by a solution having greater etching rate on the conductive material than on the insulating layer. For example, in some embodiments, the portion of the patterned conductive layer 232p can be removed by a hydrogen peroxide ($H_2O_2$) dipping. By using $H_2O_2$ dipping for approximately 30 seconds, the portion of the patterned conductive layer 232p can be removed nearly without consuming the insulating layer 240. As shown in FIG. 2G, the portion of the patterned conductive layer 232p is removed to form a second electrode 232e and to expose a second portion of the insulating layer 240b. It should be noted that because the insulating layer 240 is nearly impervious to the removing of the portion of the patterned conductive layer 232p, a thickness of the second portion 240b of the insulating layer 240 is greater than the thickness of the first portion 240a of the insulating layer 240. In some embodiments, a width of the first portion 240a is greater than a width of the second portion 240b. It should be noted that the width of the second portion 240b is related to the process duration of the $H_2O_2$ dipping. In some embodiments, the width of the second portion 240b is between approximately 0 Å and approximately 900 Å, but the disclosure is not limited thereto. Additionally, another corner Cb may be formed where the second electrode 232e is in contact with the second portion 240b of the insulating layer 240. Additionally, the metallic by-product 233 may be removed by the $H_2O_2$ dipping in some embodiments. In other embodiments, even if the metallic by-product 233 still remains at the corner Ca, it is still separated from the second electrode 232e by the second portion 240b of the insulating layer 240.

Figure 2H:
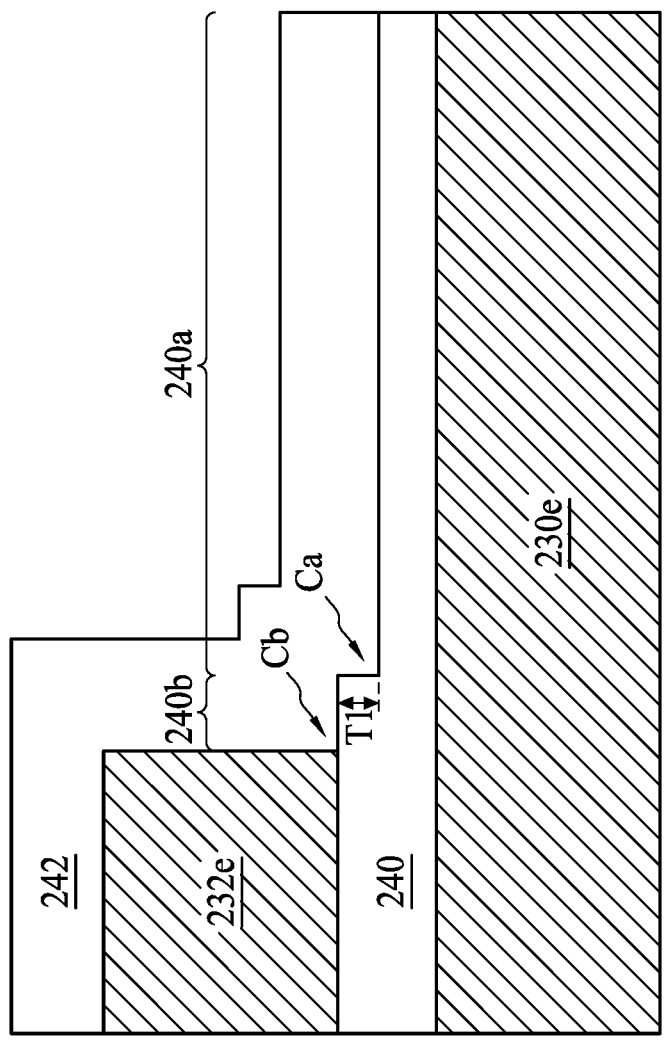

Referring to FIG. 2H, in some embodiments, another insulating layer 242 is formed on the second electrode 232e and on the insulating layer 240. The insulating layer 242 can include material the same as the insulating layer 240, and therefore such details are omitted for brevity. In some embodiments, when the insulating layers 240 and 242 include the same material, a stepped interface between insulating layers 240 and 242 may not be easily observed, and therefore, for clarity, such stepped interface is shown by a dotted line in FIG. 2H. In other embodiments, when the insulating layer 242 includes materials different from the insulating layer 240, a stepped interface between the insulating layer 242 and the insulating layer 240 may be easily observed. A thickness of the insulating layer 242 may be the same as the thickness of the insulating layer 240, and therefore such details are omitted for brevity. In some embodiments, the insulating layer 242 is conformally formed on the second electrode 232e and the insulating layer 240 and thus covers both of the corner Ca and the corner Cb.

Figure 2I:
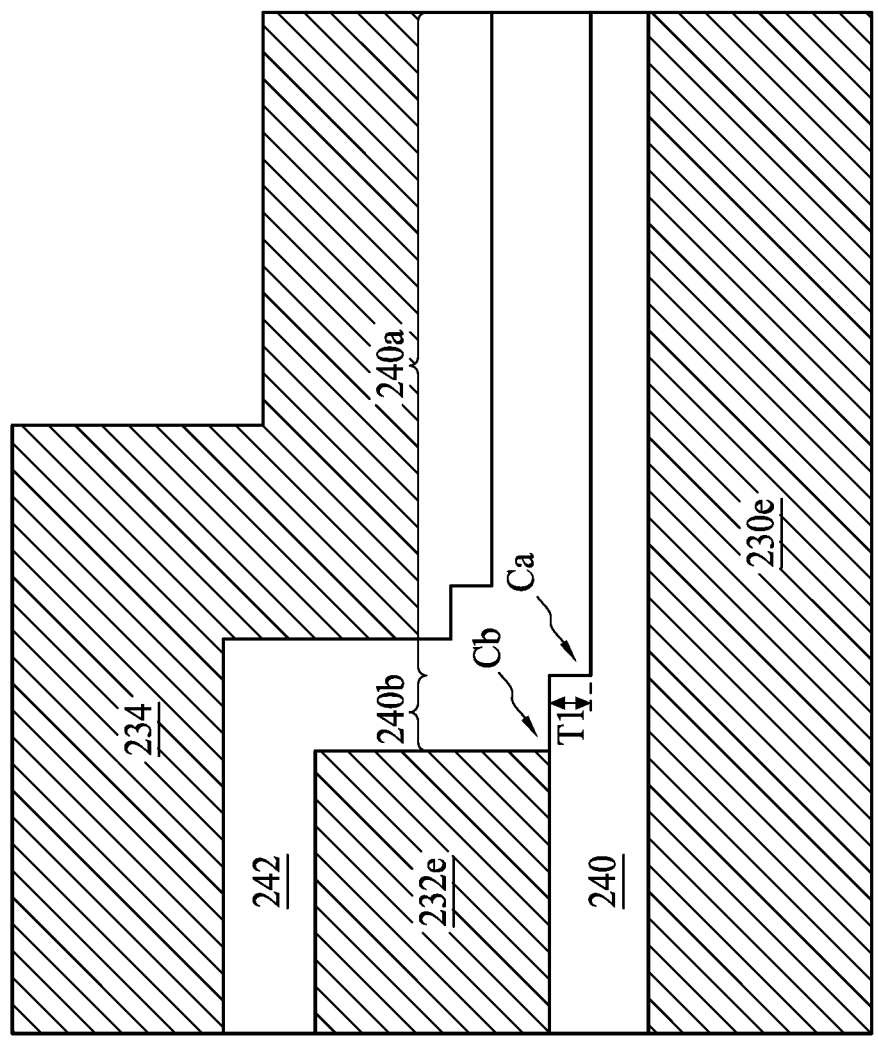

Referring to FIG. 2I, another conductive layer 234 can be formed on the insulating layer 242. The conductive layer 234 can include the same material and same thickness as the conductive layer 232. Therefore such details are omitted for brevity. Subsequently, a patterned mask layer (not shown) is formed on the conductive layer 234.

Figure 2J:
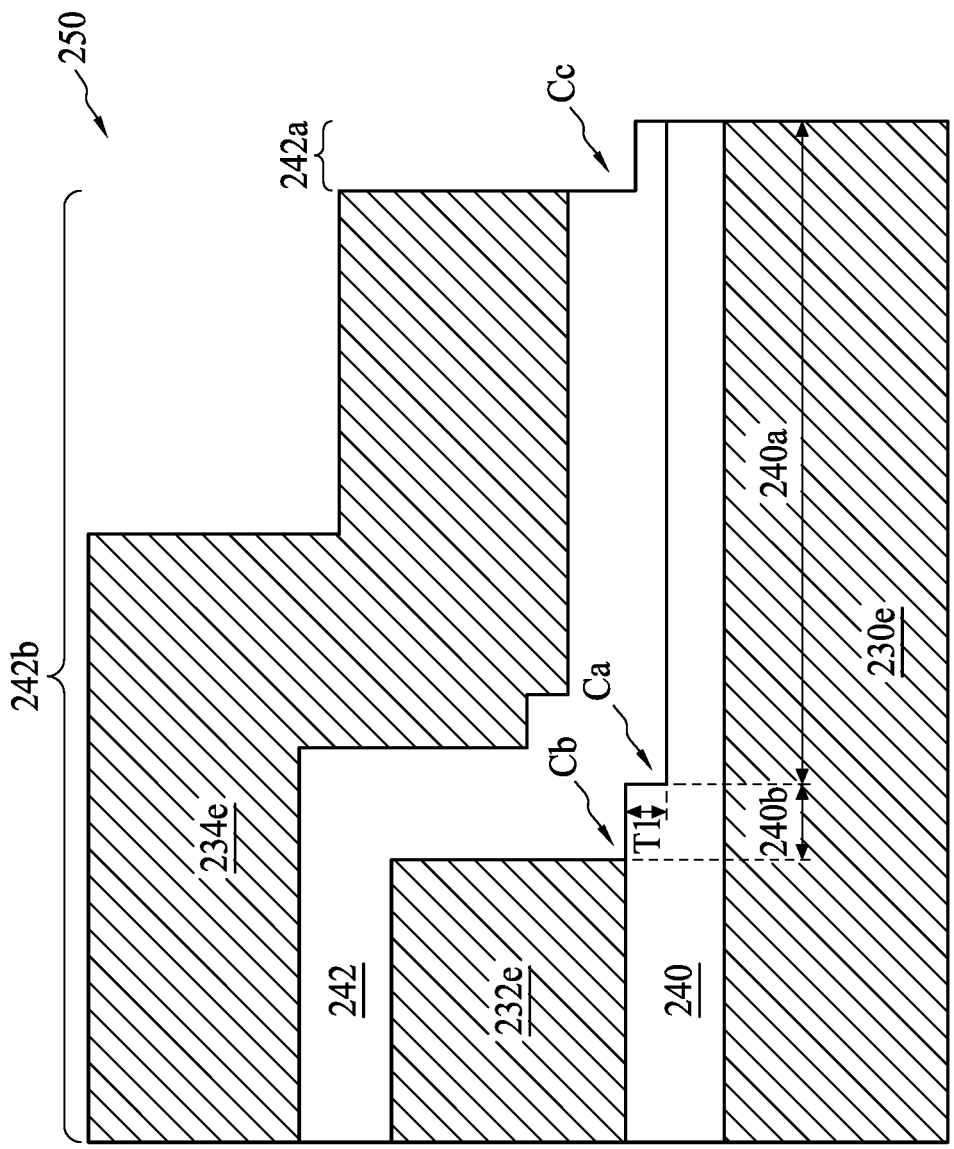

In some embodiments, operation 106 can be performed on the conductive layer 234. Referring to FIG. 2J, a portion of the conductive layer 234 is removed to form a third electrode 234e on the insulating layer 242 and expose a third portion 242a of the insulating layer 242. In some embodiments, the removing of the portion of the conductive layer 234 can include an etching technique, such as a dry etching. Additionally, the patterned mask layer can be removed after the forming of the third electrode 234e. In some embodiments, a MIM capacitor 250 including the first electrode 230e, the second electrode 232e, the third electrode 234e, the insulating layer 240 between the first electrode 230e and the second electrode 232e, and the insulating layer 242 between the second electrode 232e and the third electrode 234e is obtained. In some embodiments, the portion of the insulating layer 242 exposed through the third electrode 234e is referred to as a third portion 242a, while a portion of the insulating layer 242 under and protected by the third electrode 234e is referred to as a fourth portion 242b. As shown in FIG. 2J, the third portion 242a and the fourth portion 242b are coupled to each other.

Still referring to FIG. 2J, as mentioned above, the portion of the conductive layer 234 exposed through the patterned mask layer may be removed by an etching, and the etching not only removes the portion of the conductive layer 234 but also may consume a portion of the insulating layer 242 once the insulating layer 242 is exposed. Therefore, the third portion 242a of the insulating layer 242 may be consumed by the etching, and thus a thickness of the third portion 242a of the insulating layer 242 may be reduced. In other words, the thickness of the third portion 242a of the insulating layer 242 is less than the thickness of the fourth portion 242b of the insulating layer 242. Further, because a thickness of the third portion 242a exposed through the third electrode 234e is reduced, a corner Cc may be formed between the third portion 242a and the fourth portion 242b. It should be noted that because the insulating layer 242 is formed on the insulating layer 240 as shown in FIG. 2J, the thickness reduction at the corner Cc renders much less effect on the capacitor than the thickness reduction at the corner Ca. However, in some embodiments, the operation 108 can be performed on the third electrode 234e.

Figure 2K:
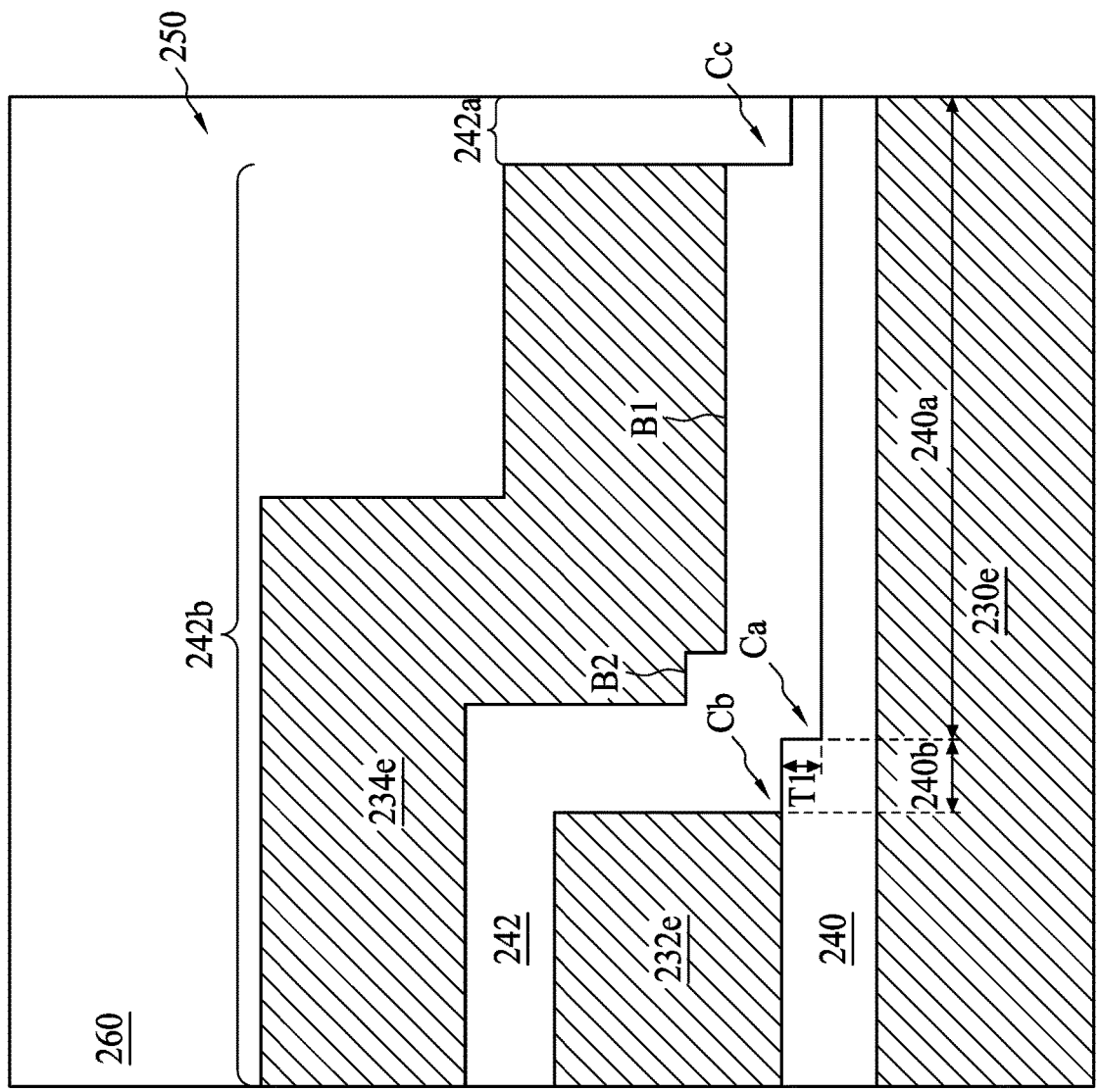

Referring to FIG. 2K, a dielectric layer 260 is formed to cover the MIM capacitor 250 entirely. In some embodiments, the dielectric layer 260 can be formed and then planarized to obtain an even surface, as shown in FIG. 2K. The dielectric layer 260 can include a low-k dielectric material, such as PEOX-USG, but the disclosure is not limited thereto. In some embodiments, a thickness of the insulating layer 260 can be between approximately 20000 Å and approximately 50000 Å, but the disclosure is not limited to this. The insulating layer 260 not only provides electrical isolation, but also provides sufficient mechanical strength to withstand stress. In some embodiments, the thickness of the insulating layer 260 can be even greater than 50000 Å in order to withstand the stress.

Figure 2L:
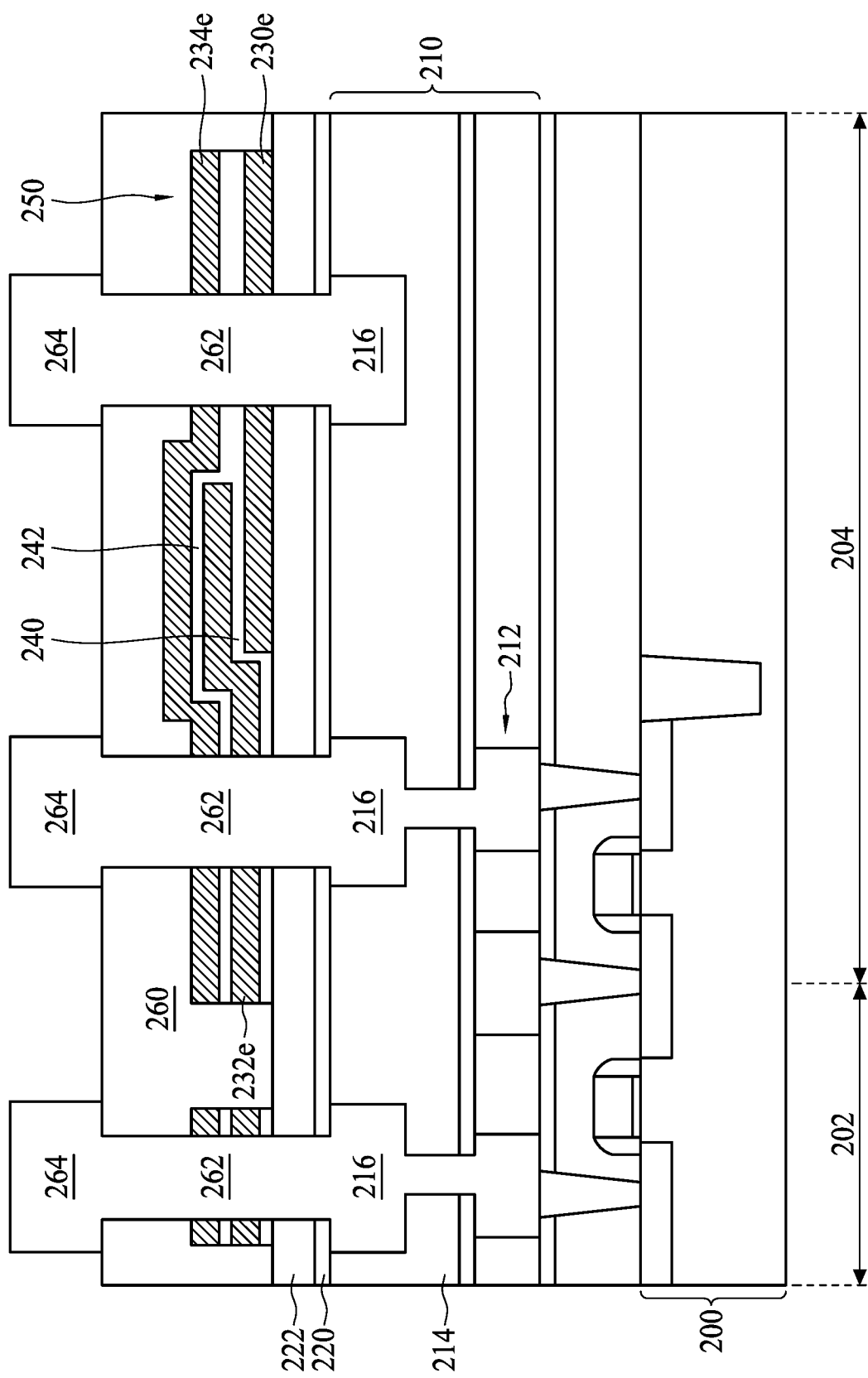

Referring to FIG. 2L, in some embodiments, a via 262 penetrating the dielectric layer 260 is formed. In some embodiments, the via 262 may include a diffusion barrier layer (not shown) and a conductive material. The diffusion barrier layer may include single layer in some embodiments. In some alternative embodiments, the diffusion barrier layer may include a multiple layer. For example but not limited thereto, the diffusion barrier layer can include Ta, TaN, Ti or TiN. The conductive material of the via 262 may include Cu, Al, W, Co, or alloys thereof, such as AlCu, but the disclosure is not limited thereto.

Still referring to FIG. 2L, the via 262 also penetrates the insulating layers 240 and 242, and the insulating layers 222 and 220. Consequently, the dielectric layers and insulating layers 260, 240, 242, 222 and 220 are in contact with sidewalls of the via 262, while the topmost conductive layer 216 is in contact with a bottom of the via 262. In some embodiments, the via 262 penetrates not only the dielectric layers and the insulating layers 260, 240, 242, 222 and 220, but also the first electrode 230e and the third electrodes 234e. In such embodiments, the topmost conductive layer 216 is electrically connected to the first and third electrodes 230e and 234e through the via 262. In other embodiments, the via 262 further penetrates the second electrode 232e and the third electrode 234e, and thus the topmost conductive layer 216 is electrically connected to the second and third electrodes 232e and 234e through the via 262. A terminal 264 can be formed on the via 262. In some embodiments, the terminal 264 can include W, Al, Cu, or AlCu, but the disclosure is not limited thereto.

Figure 2M:
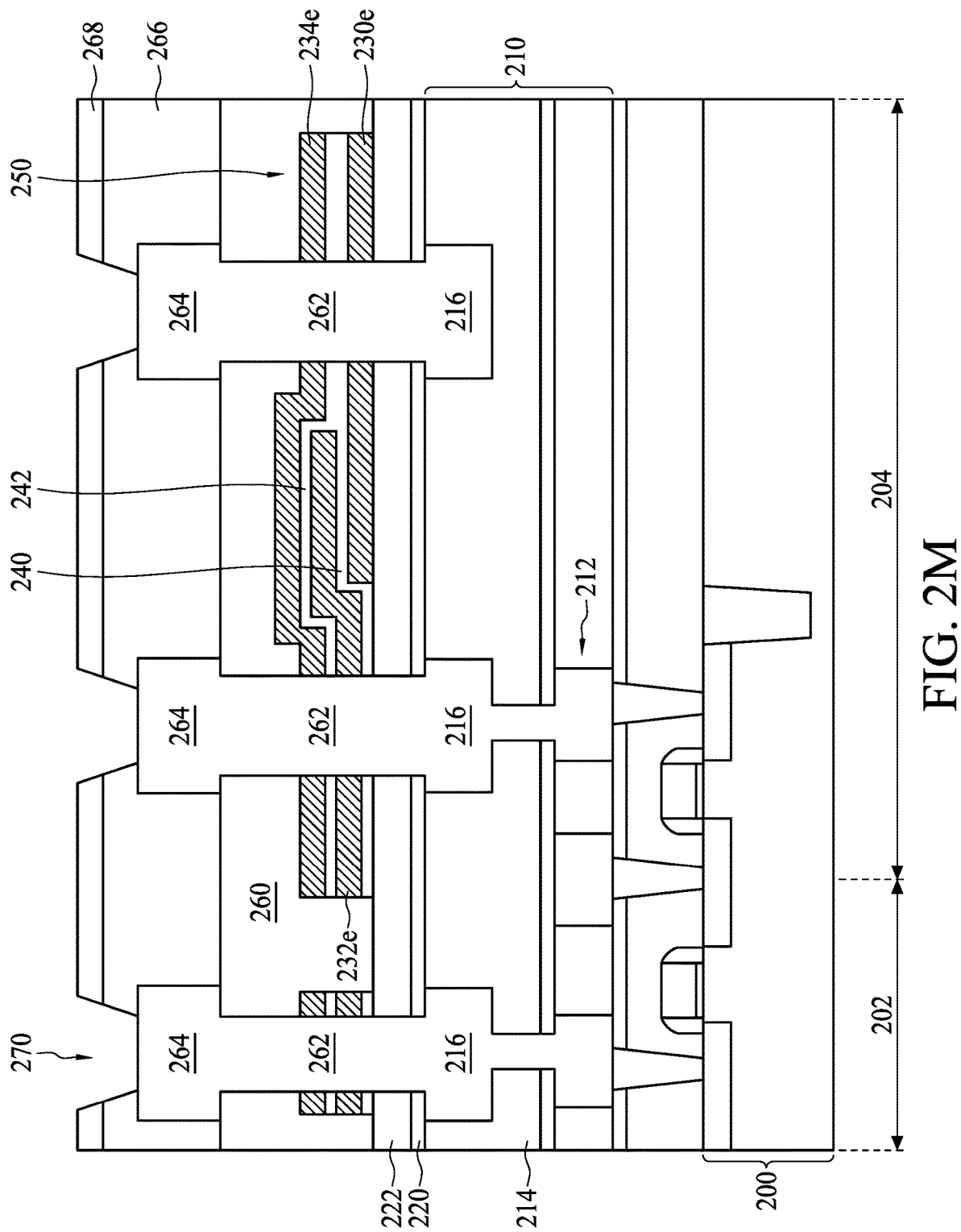

Referring to FIG. 2M, further, a dielectric layer 266 and a dielectric layer 268 are formed over the dielectric layer 260. Next, an opening 270 is formed in the insulating layers 266 and 268 to expose the connecting pad 264, as shown in FIG. 2M. Accordingly, a semiconductor structure 20 including at least a MIM capacitor 250 is obtained.

It should be noted that two of the three electrodes 230e, 232e and 234e are electrically connected to the via 262 and the terminal 264. The terminal 264 exposed through the opening 270 is used to receive external signals. When voltage is applied to the MIM capacitor 250, currents may flow into the MIM capacitor 250 through the two of the three electrode 230e, 232e and 234e. The MIM capacitor 250 therefore allows high frequency noise on direct current (DC) power lines to be shunted directly between the lines, preventing the noise from reaching internal devices disposed in the substrate 200 through the topmost conductive layer 216. In some embodiments, the MIM capacitor 250 therefore may help to provide more stable power to the internal devices. Additionally, if a power supply is required to switch between various modes of operation, an adequate decoupling capacitance can act as an energy reserve, lessening the magnitude of undesired dips in voltage during mode switching events. Accordingly, the MIM capacitor 250 can serve as a filter in some embodiments of the present disclosure.

Referring back to FIG. 2K again, in some embodiments, a semiconductor structure, such as MIM capacitor 250, is provided. The semiconductor structure includes a substrate 200 (shown in FIG. 2L), a first electrode 230e over the substrate 200, a second electrode 232e over the first electrode 230e, a third electrode 234e over the second electrode 232e, an insulating layer 240 between the first electrode 230e and the second electrode 232e, and an insulating layer 242 between the second electrode 232e and the third electrode 234e. In some embodiments, the insulating layer 240 and the insulating layer 242 are disposed together between the first electrode 230e and the third electrode 234e. In some embodiments, the first electrode 230e is referred to as a bottom electrode, the second electrode 232e is referred to as a middle electrode, and the third electrode 234e is referred to as a top electrode.

The insulating layer 240 has a first portion 240a and a second portion 240b coupled to the first portion 240a. As shown in FIG. 2K, the second portion 240b of the insulating layer 240 is in contact with the second electrode 232e, such as a sidewall of the second electrode 232e, while the first portion 240a of the insulating layer 240 is separated from the second electrode 232e by the second portion 240b. Accordingly, a corner Ca may be formed where the first portion 240a is coupled to the second portion 240b, and a corner Cb may be formed where the second portion 240b is in contact with the sidewall of the second electrode 232e. Further, the thickness of the second portion 240b is greater than the thickness of the first portion 240a. In some embodiments, the thickness of the second portion 240b of the insulating layer 240 is between approximately 60 Å and approximately 100 Å, depending on different product requirements, and the thickness of the first portion 240a of the insulating layer 240 is less than approximately 60 Å. In some embodiments, because the insulating layer 240 has the first portion 240a and the second portion 240b, a stepped interface may be formed between the insulating layer 240 and the insulating layer 242.

Still referring to FIG. 2K, a width of the second portion 240b is less than a width of the first portion 240a. In some embodiments, the width of the second portion 240b is between approximately 0 Å and approximately 900 Å, but the disclosure is not limited thereto. It should be noted that if the width of second portion 240b is less than approximately 0 Å, the first portion 240a with the smaller thickness may be close to the corner Cb, and the Vbd failure issue may not be mitigated. However if the width of second portion 240b is greater than approximately 900 Å, the function of the MIM capacitor 250 may be adversely impacted because the width of the second electrode 232e is reduced.

The insulating layer 242 includes a third portion 242a and a fourth portion 242b coupled to the third portion 242a. As mentioned above, the fourth portion 242b is under and in contact with the third electrode 234e, while the third portion 242a is exposed through and separated from the third electrode 234e. A thickness of the fourth portion 242b is greater than a thickness of the third portion 242a. Further, the thickness of the fourth portion 242b of the insulating layer 242 between the second electrode 232e and the third electrode 234e, and between the first electrode 230e and the third electrode 234e, is consistent.

Still referring to FIG. 2K, on the other hand, the third electrode 234e may include a first bottom surface B1 and a second bottom surface B2. The first bottom surface B1 is adjacent to the corner Cc, and the second bottom surface B2 is separated from the corner Cc by the first bottom surface B1. The first bottom surface B1 and the second bottom surface B2 are in different levels. In some embodiments, the second bottom surface B2 is higher than the first bottom surface B1. Further, a width of the first bottom surface B1 is greater than a width of the second bottom surface B2. In some embodiments, the width of the second bottom surface B2 is substantially equal to the width of the second portion 240b of the insulating layer 240, but the disclosure is not limited thereto. A distance between the first electrode 230e and the first bottom surface B1 of the third electrode 234e is less than a distance between the first electrode 230e and the second bottom surface B2 of the third electrode 234e.

According to the MIM capacitor 250 provided by the present disclosure, the second electrode 232e undergoes a pull-back, which is achieved by, for example but not limited thereto, an $H_2O_2$ dipping, therefore the thinned first portion 240a of the insulating layer 240 is separated from the corner Cb by the second portion 240b. Consequently, the Vbd failure issue is mitigated because the insulating layer 240 between the two electrodes (i.e., the first electrode 230e and the second electrode 232e) is thick enough. Further, by pulling back the second electrode 232e, the metallic byproduct formed by the etching technique can be removed or separated from the sidewall of the second electrode 232e by the second portion 240b of the insulating layer 240; therefore, the leakage path is separated or eliminated, and thus Vbd failure issue is further mitigated.

In some embodiments, a semiconductor structure is provided. The semiconductor structure includes a substrate, a first electrode over the substrate, a second electrode over the first electrode, and a first insulating layer between the first electrode and the second electrode. The first insulating layer has a first portion and a second portion coupled to the first portion, the second portion of the first insulating layer is in contact with the second electrode, and the first portion is separated from the second electrode by the second portion. A thickness of the second portion is greater than a thickness of the first portion.

In some embodiments, a semiconductor structure is provided. The semiconductor structure includes a first electrode, a second electrode over the first electrode, a third electrode over the second electrode, a first insulating layer between the first electrode and the second electrode, and a second insulating layer between the second electrode and the third electrode. The third electrode includes a first bottom surface and a second bottom surface. The first bottom surface and the second bottom surface are at different levels. A width of the first bottom surface is greater than a width of the second bottom surface.

In some embodiments, a method for manufacturing a semiconductor structure is provided. The method includes the following operations. A substrate including a first electrode and a first insulating layer on the first electrode is received. A first conductive layer is formed on the first insulating layer. A portion of the first conductive layer is removed to form a patterned first conductive layer on the first insulating layer and to expose a first portion of the first insulating layer. A portion of the patterned first conductive layer is removed to form a second electrode and to expose a second portion of the first insulating layer. A thickness of the second portion of the first insulating layer is greater than a thickness of the first portion of the first insulating layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor structure comprising:
   a substrate;
   a first electrode over the substrate;
   a second electrode over the first electrode; and
   a first insulating layer between the first electrode and the second electrode,
   wherein the first insulating layer has a first portion and a second portion coupled to the first portion, the second portion of the first insulating layer is in contact with the second electrode, the first portion is entirely separated from the second electrode by the second portion, and a thickness of the second portion is greater than a thickness of the first portion,
   wherein the first insulating layer comprises a third portion coupled to the second portion and entirely covered by the second electrode, the second portion is disposed between the first portion and the third portion, and the first portion and the second portion of the first insulating layer are entirely exposed through the second electrode.

2. The semiconductor structure of claim 1, wherein the thickness of the second portion of the first insulating layer is between approximately 60 angstroms (Å) and approximately 100 Å.

3. The semiconductor structure of claim 2, wherein the thickness of the first portion of the first insulating layer is less than approximately 60 Å.

4. The semiconductor structure of claim 1, wherein a width of the second portion is between approximately 0 Å and approximately 900 Å.

5. The semiconductor structure of claim 1, further comprising a third electrode over the second electrode and a second insulating layer between the third electrode and the second electrode.

6. The semiconductor structure of claim 5, wherein the second insulating layer has a fourth portion and a fifth portion coupled to the fourth portion, and a thickness of the fifth portion is greater than a thickness of the fourth portion.

7. The semiconductor structure of claim 5, further comprising a stepped interface between the first insulating layer and the second insulating layer.

8. The semiconductor structure of claim 5, wherein the first portion and second portion of the first insulating layer are in contact with the second insulating layer.

9. A semiconductor structure comprising:
   a substrate;
   a first electrode over the substrate;
   a second electrode over the first electrode; and
   a first insulating layer between the first electrode and the second electrode;
   wherein the first insulating layer has a first portion, a second portion coupled to the first portion, a first corner formed by the first portion and the second portion, and a second corner formed by the second portion and the second electrode, and the second corner and the first corner are at different levels, wherein the second portion has a top surface exposed through the second electrode and a sidewall coupling the top surface and the first portion, the top surface of the first portion and the sidewall of the second electrode form the first corner, and the top surface of the second portion and a sidewall of the second electrode form the second corner.

10. The semiconductor structure of claim 9, wherein a thickness of the second portion of the first insulating layer is greater than a thickness of the first portion of the first insulating layer.

11. The semiconductor structure of claim 9, wherein the first insulating layer further has a third portion covered by and in contact with the second electrode, and a thickness of the third portion of the first insulating layer is similar to a thickness of the second portion of the first insulating layer.

12. The semiconductor structure of claim 9, wherein a width of the first portion of the first insulating layer is greater than a width of the second portion of the first insulating layer.

13. The semiconductor structure of claim 9, further comprising a third electrode over the second electrode and a second insulating layer between the third electrode and the second electrode.

14. The semiconductor structure of claim 13, wherein the second insulating layer has a third portion and a fourth portion coupled to the third portion, and a thickness of the fourth portion is greater than a thickness of the third portion.

15. The semiconductor structure of claim 13, further comprising:
   a first stepped interface between the first insulating layer and the second insulating layer; and
   a second stepped interface between the second insulating layer and the third electrode.

16. A semiconductor structure comprising:
   a substrate;
   a first electrode over the substrate;
   a second electrode over the first electrode;
   a third electrode over the second electrode;
   a first insulating layer between the first electrode and the second electrode, wherein the first insulating layer has a first portion and a second portion coupled to the first portion, and the first portion is separated from the second electrode by the second portion; and
   a second insulating layer between the second electrode and the third electrode, wherein the second insulating layer has a third portion and a fourth portion coupled to the third portion, and the third portion is separated from the second electrode by the fourth portion,
   wherein a thickness of the second portion of the first insulating layer is greater than a thickness of the first portion of the first insulating layer, and a thickness of the fourth portion of the second insulating layer is greater than a thickness of the third portion of the second insulating layer, and
   wherein the first insulating layer has a fifth portion covered by and in contact with the second electrode, and a thickness of the fifth portion of the first insulating layer is similar to the thickness of the second portion of the first insulating layer.

17. The semiconductor structure of claim 16, wherein the first portion and the second portion of the first insulating layer are in contact with the second insulating layer.

18. The semiconductor structure of claim 16, further comprising:
   a first stepped interface between the first insulating layer and the second insulating layer; and
   a second stepped interface between the second insulating layer and the third electrode.

19. The semiconductor structure of claim 16, further comprising:
   a first corner formed by the first portion of the first insulating layer and the second portion of the first insulating layer; and
   a second corner formed by the second portion of the first insulating layer and the second electrode.

20. The semiconductor structure of claim 1, wherein a thickness of the third portion of the first insulating layer is similar to the thickness of the second portion of the first insulating layer.

* * * * *